United States Patent
DeFord

(10) Patent No.: US 6,848,936 B2
(45) Date of Patent: Feb. 1, 2005

(54) ELECTRONIC ASSEMBLY HAVING A SOCKET WITH FEATURES THAT ENSURE ALIGNMENT IN X- AND Y-DIRECTIONS OF A COMPONENT HELD THEREBY

(75) Inventor: Brian L. DeFord, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/446,955

(22) Filed: May 27, 2003

(65) Prior Publication Data

US 2004/0242057 A1 Dec. 2, 2004

(51) Int. Cl.⁷ .................................................. H05K 1/00
(52) U.S. Cl. ........................................ 439/526; 439/70
(58) Field of Search ................. 439/526, 525, 439/70

(56) References Cited

U.S. PATENT DOCUMENTS 5,066,245 A * 11/1991 Walker ........................ 439/526
5,713,744 A * 2/1998 Laub ............................ 439/71
6,071,139 A * 6/2000 Corisis et al. ............... 439/330
6,132,220 A * 10/2000 McHugh et al. .............. 439/66
6,164,980 A * 12/2000 Goodwin ....................... 439/70
6,534,856 B1 * 3/2003 Dozier et al. ................ 257/698
6,669,489 B1 * 12/2003 Dozier et al. .................. 439/71

* cited by examiner

Primary Examiner—Hae Moon Hyeon
(74) Attorney, Agent, or Firm—Blakely, Sokoloff, Taylor & Zafman LLP

(57) ABSTRACT

An electronic assembly is provided, with a socket body having a support plane. The support plane supports a surface of a package substrate, especially a contoured package substrate, and thereby limits the extent of travel of springs held by the socket body. Spring fingers are also provided to align the package substrate in x- and y-directions relative to the socket springs. A relief opening is formed to remove a circular chamfer that can inhibit movement of a package substrate up to side surfaces of the socket body.

3 Claims, 8 Drawing Sheets

ELECTRONIC ASSEMBLY HAVING A SOCKET WITH FEATURES THAT ENSURE ALIGNMENT IN X- AND Y-DIRECTIONS OF A COMPONENT HELD THEREBY

BACKGROUND OF THE INVENTION

1). Field of the Invention

This invention relates to an electronic assembly of the kind that may have a socket with spring contacts for making contact with terminals on a semiconductor package substrate.

2). Discussion of Related Art

Integrated circuits are usually manufactured in and on wafers that are subsequently singulated into individual dies. A die may then be mounted to a package substrate for purposes of providing rigidity to the entire package and for purposes of routing of signals to a side of the package of the substrate opposing the die.

A socket may be mounted to a circuit board, which may be shaped and dimensioned to receive the semiconductor package. The package substrate and the socket typically have matching substrate and socket contact terminals through which signals can be provided between the package substrate and the socket.

The socket may have a plurality of socket springs. The substrate contact terminals may come into contact with free ends of the socket springs and then bend cantilever portions of the springs by movement of the substrate contact terminals toward a body of the socket. Forces created by the springs ensure good contact between the free ends of the springs and the socket contact terminals.

BRIEF DESCRIPTION OF THE DRAWINGS

The invention is described by way of example with reference to the accompanying drawings, wherein.

DETAILED DESCRIPTION OF THE INVENTION

Figure 1:
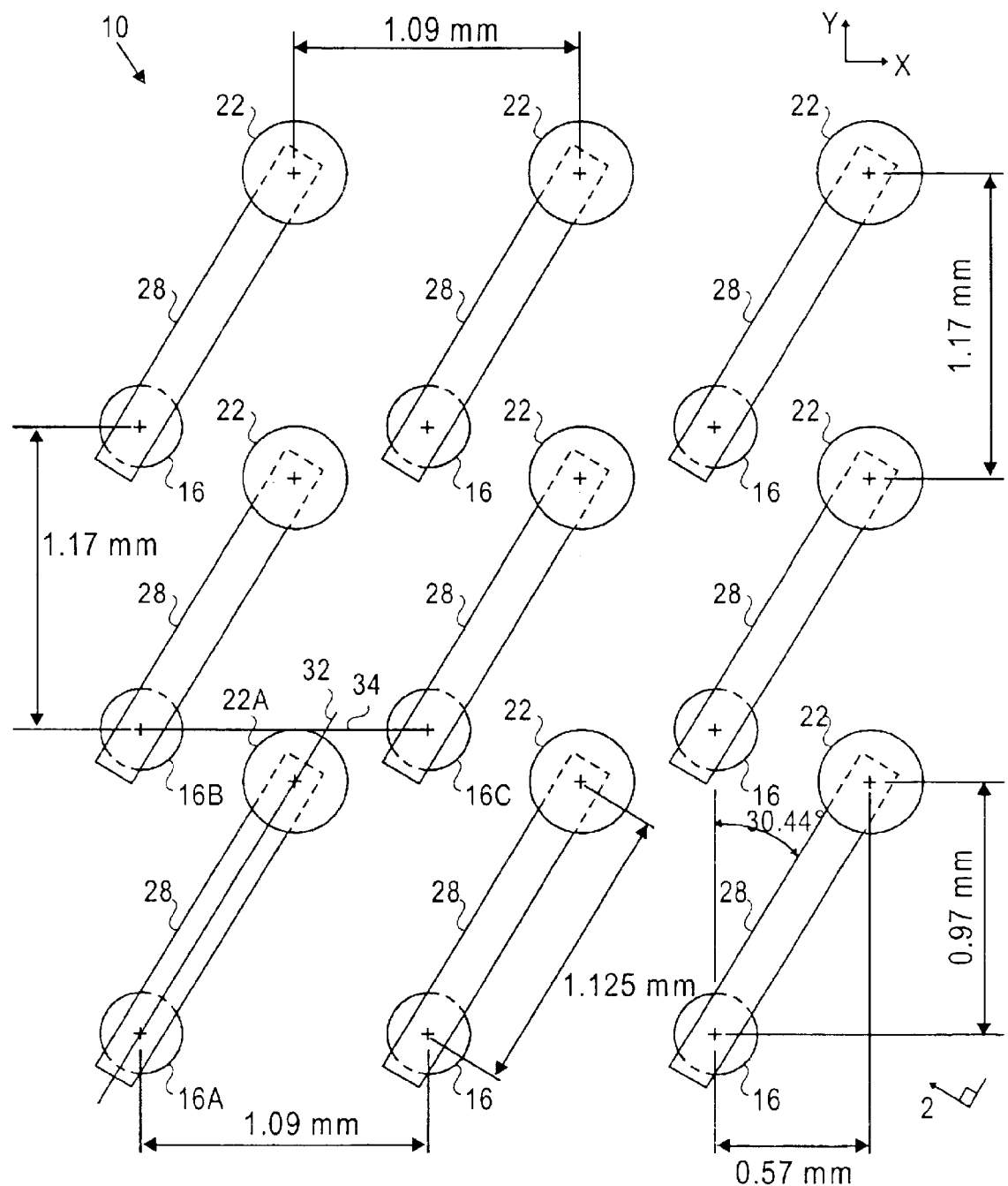
FIG. 1 is a top plan view of portions of an electronic assembly including socket solder balls, socket springs, and substrate contact terminals.
Figure 2:
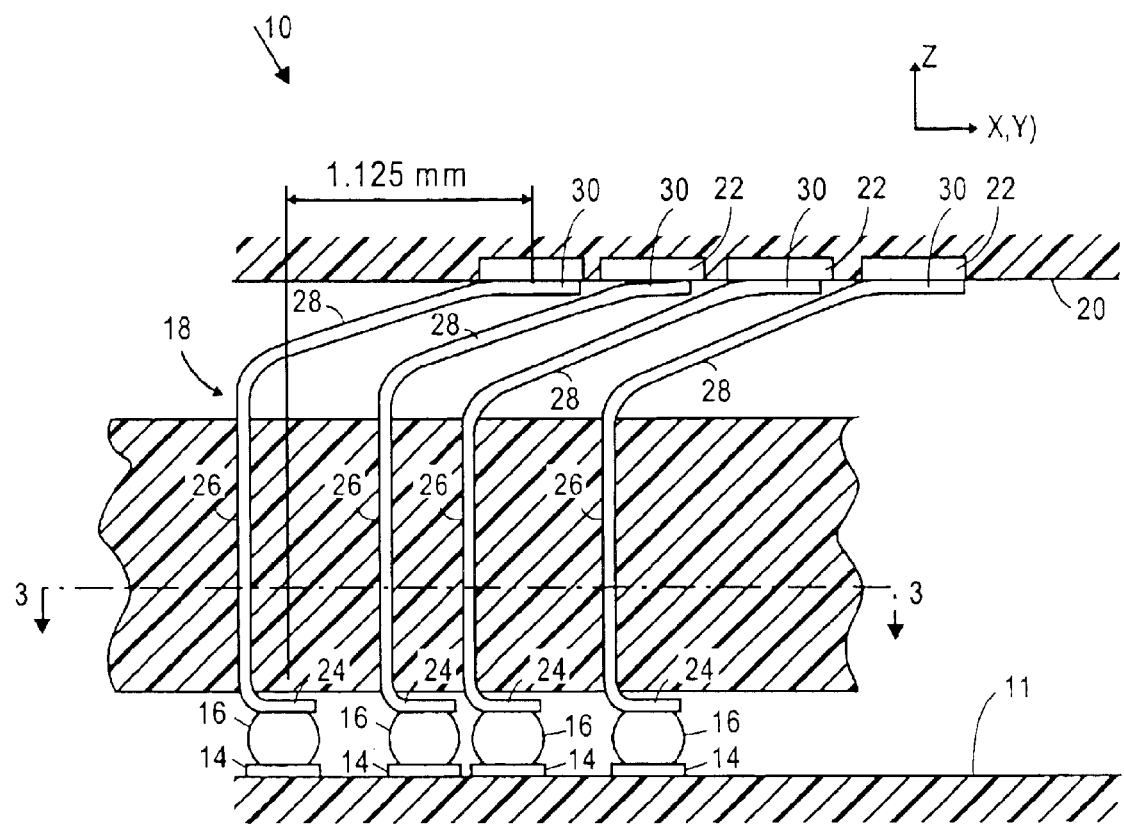
FIG. 2 is a side view in a direction 2 in FIG. 1 further illustrating additional components of the electronic assembly.

FIGS. 1 and 2 of the accompanying drawings illustrate components of an electronic assembly 10, according to an embodiment of the invention, including a printed circuit board 11, a socket body 12, printed circuit board contact terminals 14, external socket solder balls 16, internal socket springs 18, a package substrate 20, and electric lands in the form of substrate contact terminals 22.

Referring specifically to FIG. 2, the socket springs 18 are all held within the socket body 12. A base portion 24 of each socket spring 18 has a respective socket solder ball 16 secured thereto. Each socket solder ball 16 is attached to a respective one of the printed circuit board contact terminals 14.

Each socket spring 18 has a respective spacer portion 26 extending in a z-direction from the base portion 24 thereof, and a respective cantilever portion 28 extending diagonally at an angle relative to the z-direction from an upper end of the respective spacer portion 26 thereof. The spacer portions 26 are held within openings in the socket body 12, and the cantilever portions 28 are above the socket body 12. A free end 30 of a respective cantilever portion 28 can be moved in a z-direction against a bending spring force of the cantilever portion 28.

The substrate contact terminals 22 are located on a lower surface of the package substrate 20. Each substrate contact terminal 22 is brought into contact with a respective free end 30 of a respective socket spring 18. The package substrate 20 is subsequently moved closer to the socket body 12. Movement of the package substrate 20 toward the socket body 12 bends the cantilever portions 28, which creates a spring force between a respective free end 30 and a respective substrate contact terminal 22. The spring force ensures good contact between the respective free end 30 and the respective substrate contact terminal 22.

As illustrated in FIG. 1, center points of the socket solder balls 16, cantilever portions 28, and center points of the substrate contact terminals 22 are dimensioned, spaced, and oriented in a manner that allows for a denser routing of signals over a given surface while still allowing sufficient flexibility of the cantilever portions 28.

Center points of the socket solder balls 16 are in an array having rows extending in an x-direction and columns extending in a y-direction. The columns in which the socket solder balls 16 are located are spaced from one another by a distance of 1.09 mm. The rows in which the socket solder balls 16 are located are spaced from one another by a larger distance of 1.17 mm. The larger pitch in the y-direction is due to design constraints for routing traces on a printed circuit board 11 to which the socket body 12 is mounted.

Center points of the substrate contact terminals 22 are also in an array of rows extending in an x-direction and columns extending in a y-direction. The columns in which the substrate contact terminals 22 are located are spaced from one another by a distance of 1.09 mm. The rows in which the substrate contact terminals 22 are located are spaced from one another by a distance of 1.17 mm. The spacing of the rows and columns of center points of the substrate contact terminals 22 is thus exactly the same as the spacing between the rows and columns of center points of the socket solder balls 16. The array formed by center points of the substrate contact terminals 22 is, however, offset relative to the array formed by center points of the socket solder balls 16 by a distance of 0.57 mm in the x-direction and 0.97 mm in the y-direction.

The cantilever portions 28 are oriented at an angle of 30.44°, measured clockwise relative to the y-direction. The ideal angle can be represented by the formula:

$$A = \text{TAN}^{-1}(\text{pitch in } x\text{-direction}/(\text{pitch in } y\text{-direction} \times 2))$$
$$= \text{TAN}^{-1}(1.09/(0.97 \times 2))$$
$$= 29.33°$$

The difference between the actual angle of 30.44° and the ideal angle of 29.33° is due to manufacturing constraints. The actual angle is preferably not more than 5° more or less from the ideal angle.

A line 32 can be drawn from a center point of the socket solder ball 16A to a center point of the substrate contact terminal 22A. A line 34 can be drawn from a center point of a socket solder ball 16B, in the same column but in an adjacent row to the socket solder ball 16A, to a center point of a socket solder ball 16C in the same row but in a column adjacent the socket solder ball 16B. An extension of the line 32 crosses through the line 34 and would cross through its center point if the angle were 29.33°.

By orienting all the cantilever portions 28 at the stated angle relative to the y-direction, the cantilever portions 28 can be made relatively long while still positioning a relatively large number of the solder balls 16 over a given area. In the given example, the center point of the socket solder ball 16A is spaced from a center point of the substrate contact terminal 22A by a distance of 1.125 mm, although the rows are spaced from one another by only 1.17 mm, and the columns are spaced from one another by only 1.09 mm.

Figure 3:
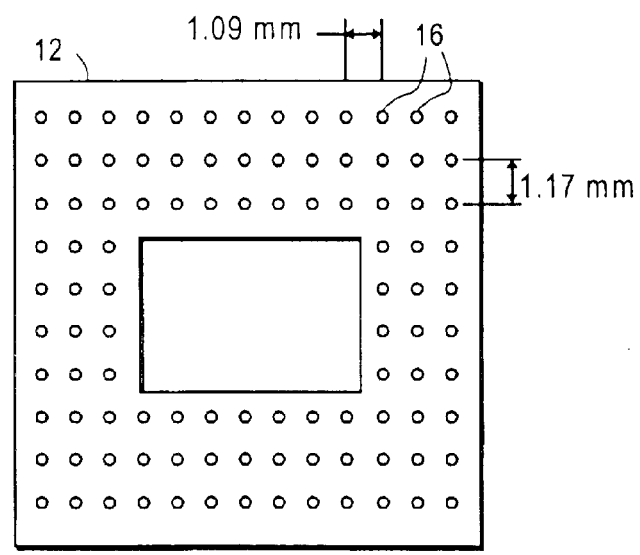
FIG. 3 is a top plan view on 3—3 in FIG. 2 illustrating a layout of the socket solder balls on a socket body of the electronic assembly.

As illustrated in FIG. 3, the socket body 12 has a generally square outline. As further illustrated in FIG. 3, the socket solder balls 16 form an array near four edges of the socket body 12, while a central region of the socket body 12 is free of socket solder balls 16. The 1.09 mm spacing between columns and 1.17 mm spacing between rows is maintained over the entire array of socket solder balls 16.

Figure 4:
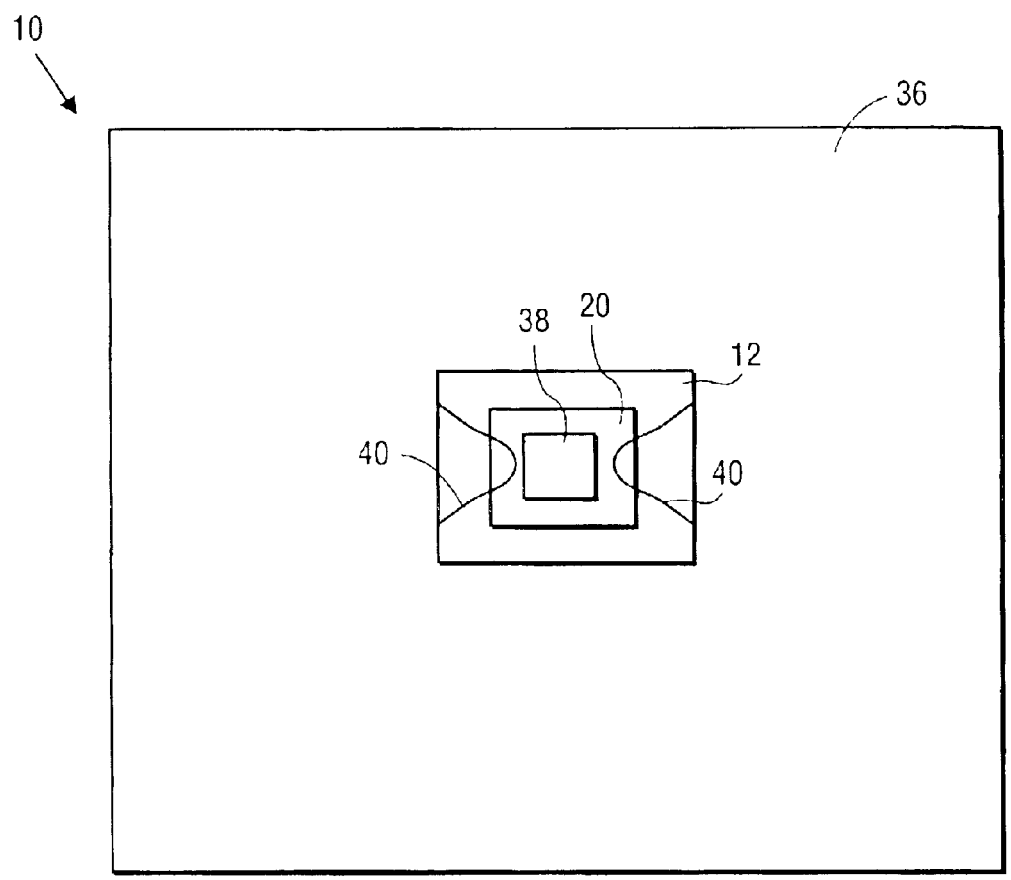
FIG. 4 is a top plan view of an outline of the entire electronic assembly.
Figure 5:
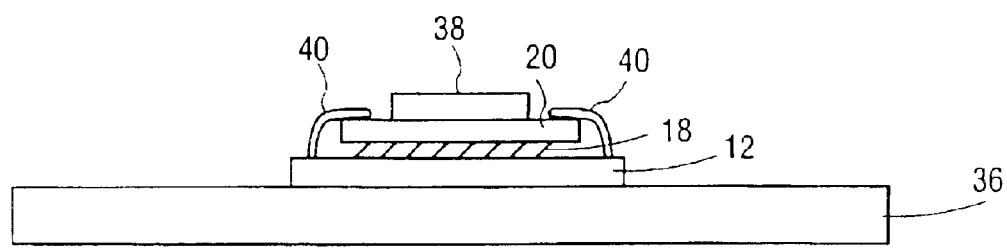
FIG. 5 is a side view of the electronic assembly illustrated in FIG. 4.

FIGS. 4 and 5 illustrate the electronic assembly 10 in more detail. The socket body 12 is mounted to a printed circuit board 36. A microelectronic die, typically a semiconductor microelectronic die 38, is mounted on the package substrate 20. The package substrate 20 is then positioned on the free ends of the socket springs 18 and moved toward the socket body 12 to bend the cantilever portions 28 of the socket springs 18. A clamp 40 secured to the socket body 12 is positioned over the package substrate 20 to retain the package substrate 20 and the socket body 12 in position in a z-direction relative to one another, so as to maintain the bend shape of the socket springs 18.

An integrated circuit in the microelectronic die 38 is connected to contacts on the package substrate 20, and through vias in the package substrate 20 to the substrate contact terminals 22. Electric interconnections provided by the printed circuit board contact terminals 14, socket solder balls 16, socket springs 18, substrate contact terminals 22, and vias in the package substrate 20 allow for signals to be transmitted between traces on the board 11 and the integrated circuit in the microelectronic die 38.

In the exemplary embodiment, a first electronic device in the form of the socket body 12 is electrically connected to a second electronic device in the form of the package substrate 20. Another embodiment may make use of the principles of the invention to connect other electronic devices to one another.

Figure 6A:
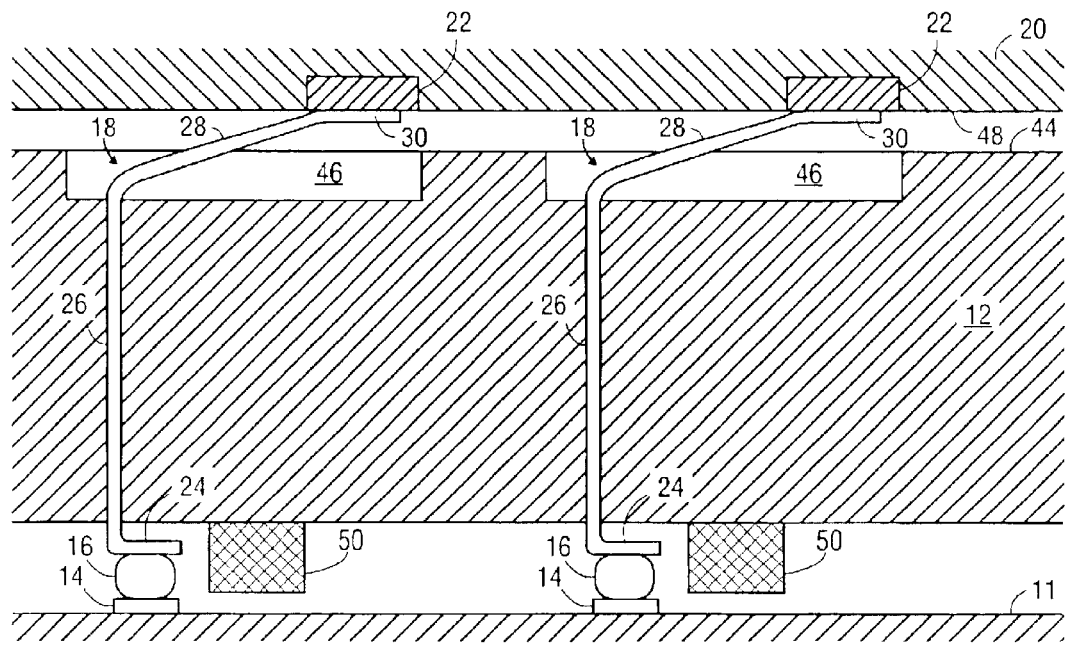
FIG. 6A is a cross-sectional side view illustrating a support plane of the socket body with recesses therein.

FIG. 6A illustrates that the socket body 12 has an upper seating plane 44 with a number of spring recesses 46 therein. A lower surface 48 of the package substrate 20 is spaced from the seating plane 44 of the socket body 12.

Figure 6B:
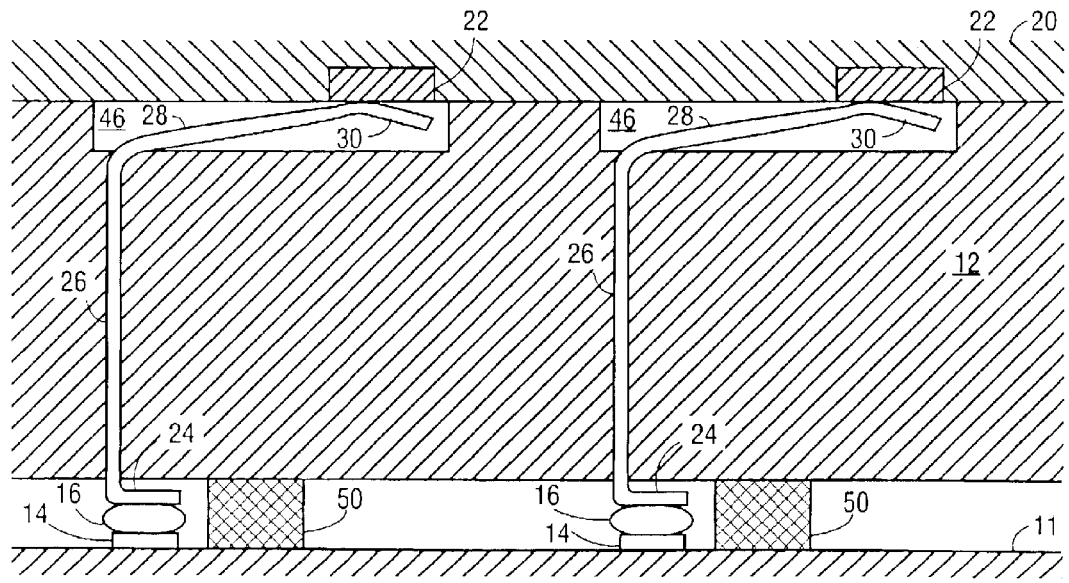
FIG. 6B is a view similar to FIG. 6A, after cantilever portions of the socket springs are bent into the recesses.

As illustrated in FIG. 6B, each cantilever portion 28 bends into a respective one of the recesses 46. The lower surface 48 of the package substrate comes into contact and is supported by the seating plane 44 of the socket body (reference numerals are indicated in FIG. 6A). The seating plane 44 thus limits the travel of the cantilever portions 28.

Referring again to FIG. 6A, the socket further has a plurality of stand-off components 50 mounted to a lower surface of the socket body 12. Lower surfaces of the stand-off components 50 are spaced from an upper surface of the printed circuit board 11. As illustrated in FIG. 6B, the socket solder balls 16 may deform at certain stages of the manufacturing or use of the assembly. The stand-off components 50 come into contact with the upper surface of the printed circuit board 11, and thereby limit the amount of deformation of the socket solder balls 16. The locations of the stand-off components 50 may depend on a particular design and may, for example, be located in positions to ensure that all the socket solder balls 16 deform by substantially the same amount.

Figure 7A:
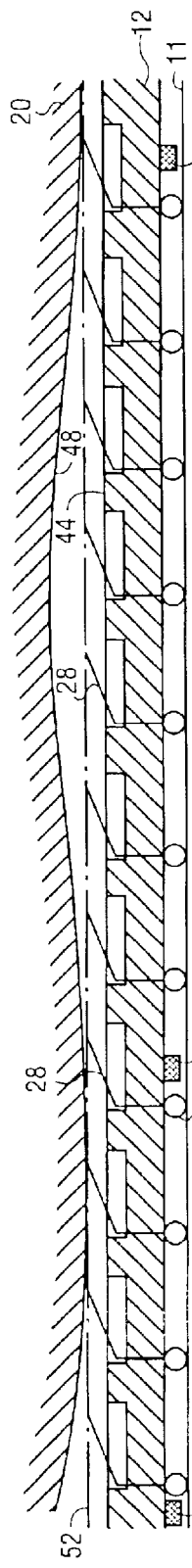
FIGS. 7A to 7D illustrate the use of the support plane to ensure an equal amount of bending of the cantilever portions, and also illustrate the use of stand-off components to reduce the risk of damage to the socket solder balls.

FIGS. 7A to 7D illustrate the implementation of the seating plane 44 and the stand-off components 50 when the lower surface 48 of the package substrate 20 is contoured. "Bowing" of the package substrate 20 usually occurs during manufacture, and is often relatively severe. By contrast, the printed circuit board 11 and socket body 12 are usually relatively planar, so that ends of the cantilever portions 28 are usually in a common plane 52. As illustrated in FIG. 7A, the lower surface 48 is spaced further from some of the cantilever portions than other ones of the cantilever portions, before any of the cantilever portions 28 are bent.

Figure 7B:
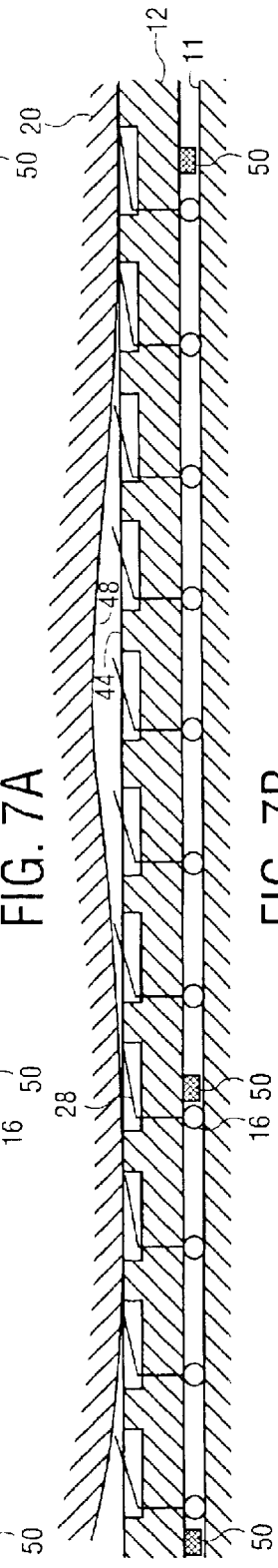

Movement of the package substrate 20 toward the socket body 12 as illustrated in FIG. 7B bends some of the cantilever portions 28 that were originally closest to the lower surface 48 in FIG. 7A, while other ones of the cantilever portions 28 are not bent, and may even be spaced from the lower surface 48. Bending of the cantilever portions 28 is, however, limited due to contact between portions of the lower surface 48 and the seating plane 44.

Figure 7C:
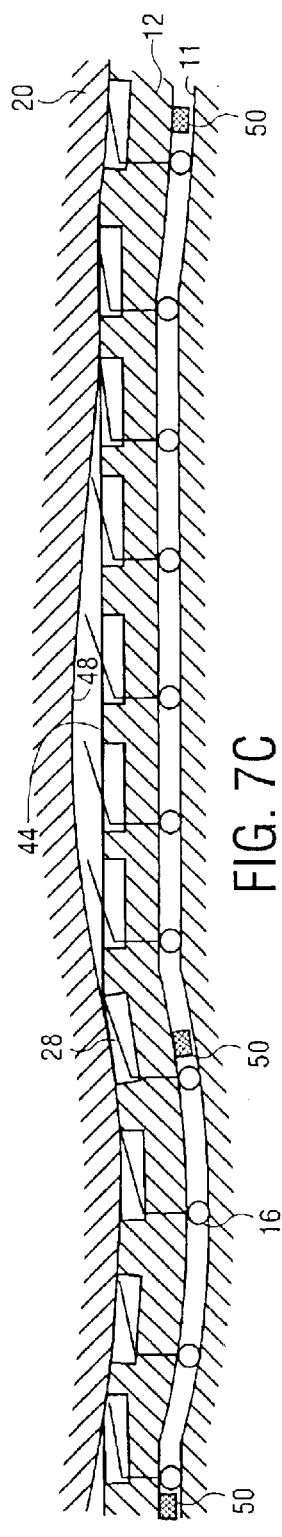
Figure 7D:
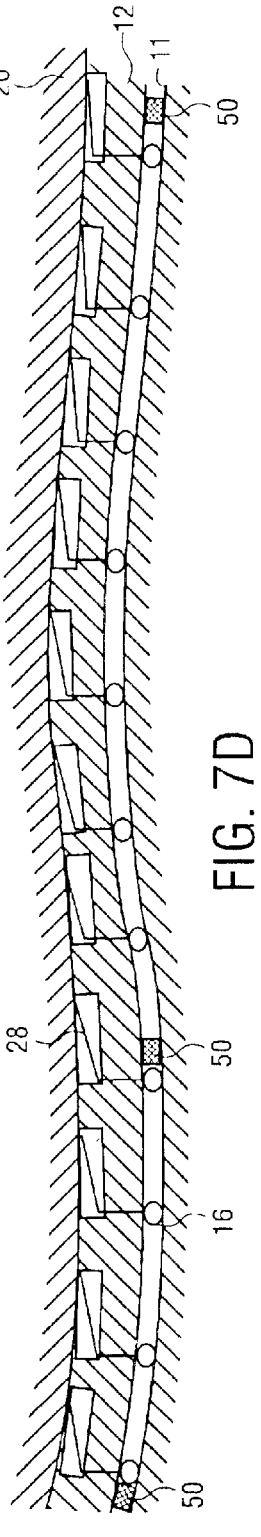

As illustrated in FIG. 7C, further movement of the package substrate 20 toward the socket body 12 results in bending of the socket body 12 by the package substrate 20. As the socket body 12 bends, larger portions of the lower surface 48 and the seating plane 44 contact one another. These larger portions "roll out" from initial contact locations illustrated in FIG. 7B. Subsequent ones of the cantilever portions 28 are bent as contact between the lower surface and the seating plane 44 increases. Each cantilever portion 28 is bent by the same amount. As illustrated in FIG. 7D, the entire lower surface 48 is eventually supported by the seating plane 44, and all the cantilever portions 28 are bent by the same degree. The seating plane 44 thereby ensures proper and uniform contact of the cantilever portions 28 with the respective substrate contact terminals on the package substrate 20. The package substrate 20 is then clamped to the socket body 12 with the clamp 40 illustrated in FIG. 5.

As illustrated in FIGS. 7C and 7D, the printed circuit board 11 is bent by the bending of the socket body 12 so that an upper surface of the printed circuit board 11 has an eventual contour that conforms substantially to a contour of the socket body 12 and the package substrate 20. It should be understood that the package substrate 20 bows in three dimensions such that a cross-section at rights angles to the cross-section of FIGS. 7A–D will also show a contoured profile of the package substrate 20, and therefore also of the socket body 12 and the printed circuit board 11 in the final assembly.

Deformation of the socket body 12 and the printed circuit board 12 may cause stresses that may tend to deform the socket solder balls 16. The stand-off components 50 are located at strategic locations that will provide support between the socket body 12 and the printed circuit board 11 where more deformation of the socket solder balls 16 may occur. The standoff components 50 thereby limit damage to the socket solder balls 16 in their vicinity, and may also create more uniform deformation from one socket solder ball 16 to the next.

Figure 8:
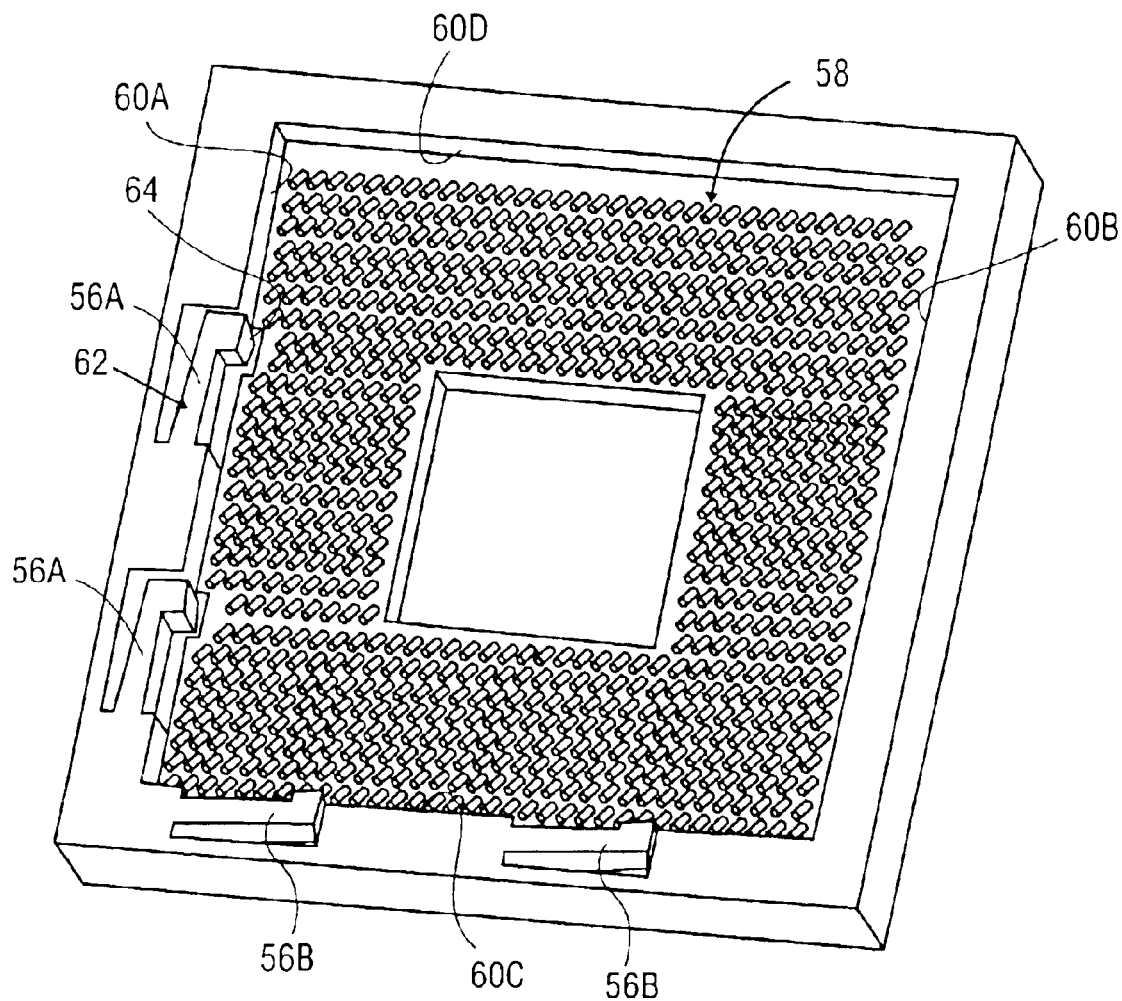
FIG. 8 is a perspective view of the socket body, further illustrating spring fingers thereon.

FIG. 8 illustrates components of the socket in more detail, including the socket body 12, and spring fingers 56 mounted to the socket body 12. The socket body 12 has a component recess 58 with left, right, front, and rear side surfaces 60A–D. Two of the spring fingers 56A are located in the left side surface 60A, and two more of the spring fingers 56B are located in the front side surface 60C. Each spring finger 56 has a respective portion 62 that bends against the sp ring action, and a respective surface 64 facing into the recess 58.

Figure 9A:
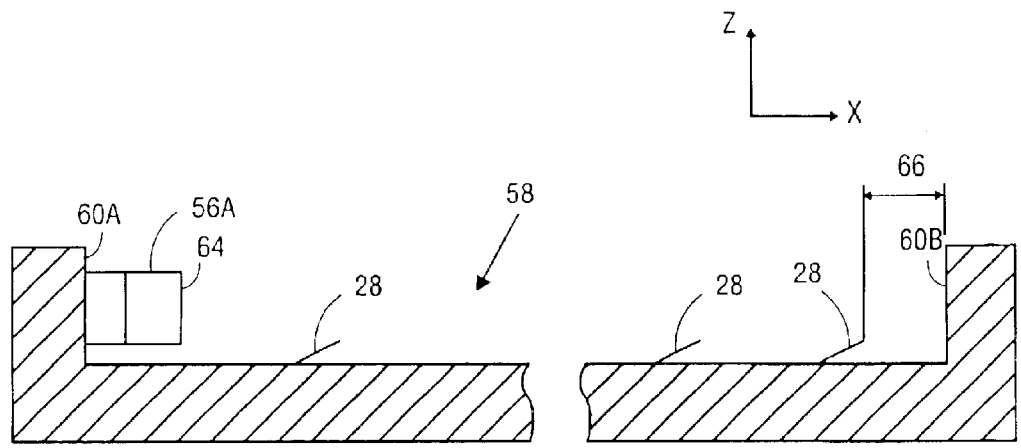
FIGS. 9A to 9C illustrate the use of the spring fingers to align the substrate contact terminals in an x-direction with respect to free ends of the socket springs.

Referring to FIG. 9A, the free ends of each one of the cantilever portions 28 of the socket springs is at a predetermined distance from the right side surface 60B.

Figure 9B:
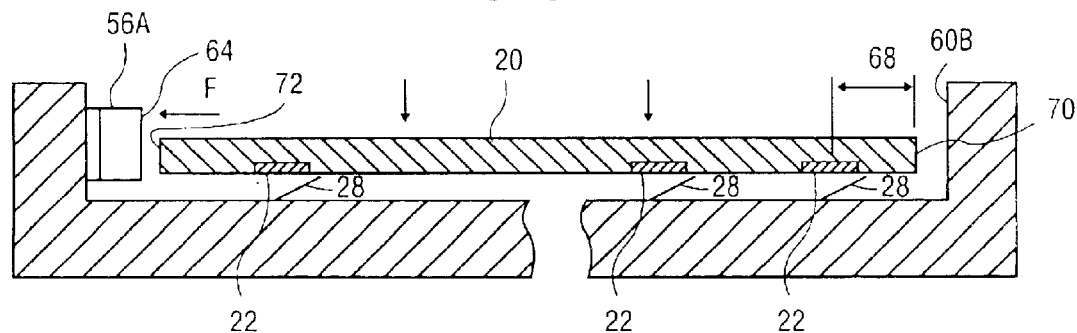
Figure 9C:
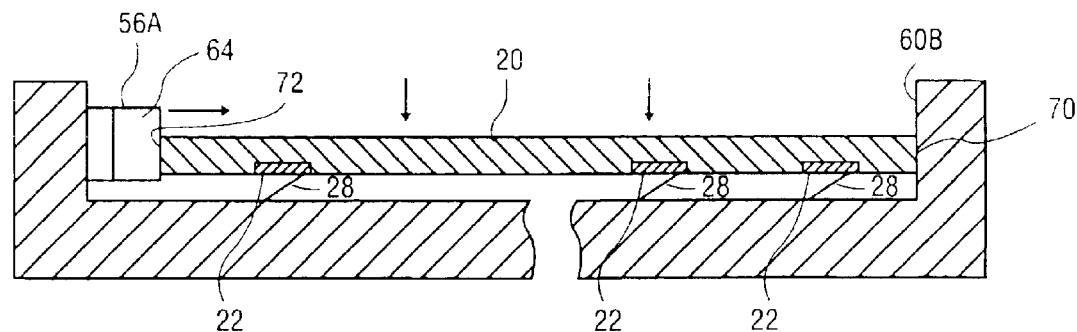

As illustrated in FIG. 9B, the spring finger 56A is bent back against a spring force F that is created when it is bent. When the spring finger 56A is bent back, a gap between the surface 64 and the side surface 60B increases to allow for the package substrate 20 to be inserted between the surface 64 and the side surface 60B. The substrate contact terminals 22 are designed to be at selected distances 68 from a side surface 70 of the package substrate 20. The distances 68 correspond to the distances 66. However, the side surface 70 may not contact the side surface 60B, so that the substrate contact terminals 22 may not necessarily all be located with center points thereof on the free ends of the cantilever portions 28.

When the force F is partially released, the surface 64 of the spring finger 56 comes into contact with a surface 72 of the package substrate 20 opposing the surface 70, and a remainder of the force F then moves the package substrate 20 until the side surface 70 thereof abuts the side surface 60B. Each substrate contact terminal 22 is then aligned with a free end of a respective one of the cantilever portions 28 in an x-direction.

Referring again to FIG. 8, both spring fingers 56A assist one another to move the package substrate in the x-direction against the side wall surface 60B. The spring fingers 56B move the package substrate 20 up against the side wall surface 60D, and align the free ends of the cantilever portions 28 in a y-direction with respect to center points of the substrate contact terminals 22. The package substrate 22 is thus biased into a corner formed by the side surfaces 60B and 60D.

Figure 10:
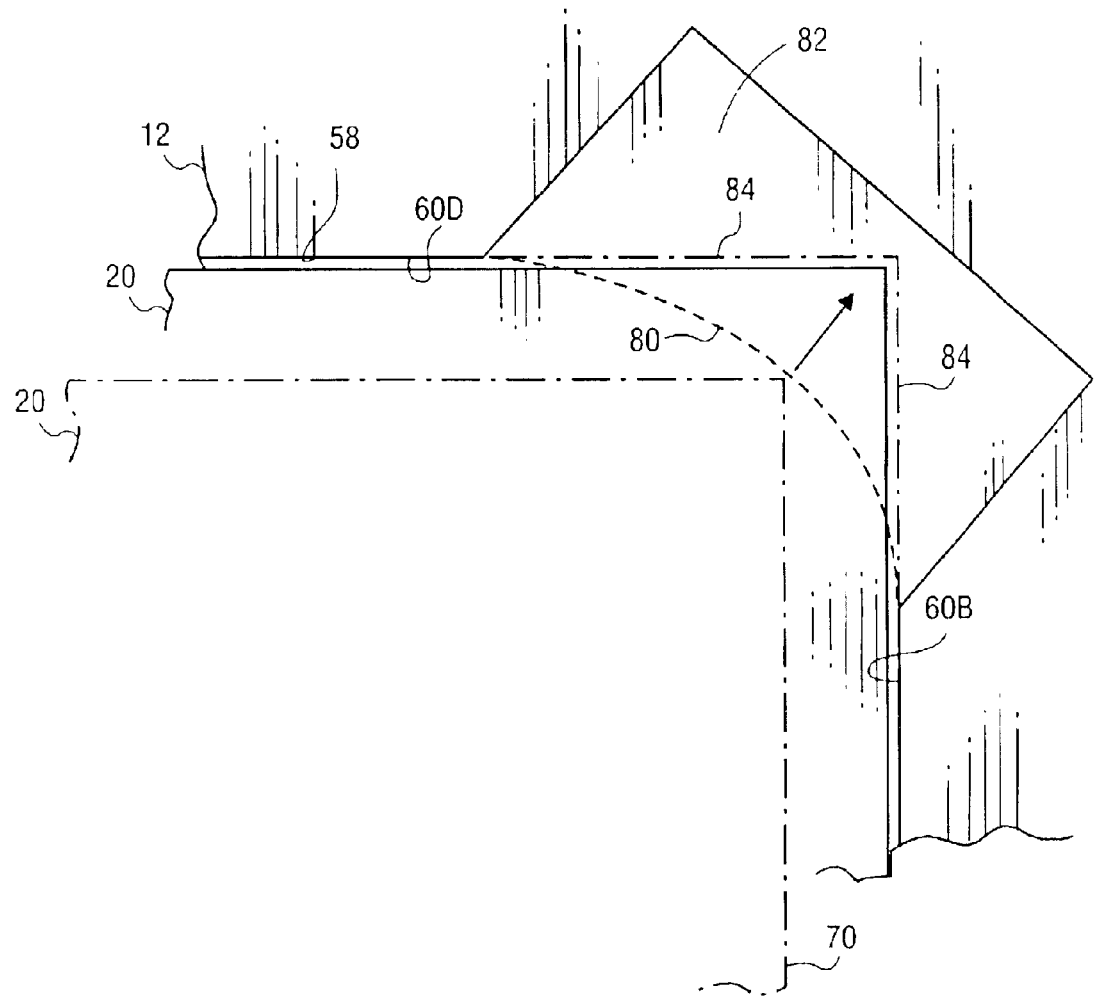
FIG. 10 is a top plan view illustrating a relief opening formed in the socket solder body.

Reference is now made to FIG. 10. Injection molding manufacturing techniques usually leave a circular chamfer connecting the sides 60B and 60D. The chamfer 80 can prevent side surfaces (e.g., surface 70) of the package substrate 20 from contacting and being aligned with the side surfaces 60B and 60D of the recess 58. As further illustrated in FIG. 10, a relief opening 82 is formed in a surface of the socket body 12 and, in the present example, has a depth that is the same as the depth of the recess 58 in the socket body. The relief opening 82 is thus in communication with the recess 58. The relief opening 82 is formed on an outside, i.e., the outer 270°, corner of extensions 84 of the side surfaces 60B and 60D. The relief opening 82 removes the chamfer 80. Side surfaces of the package substrate can then move up to, contact, and be aligned with the side surfaces 60B and 60D. A rectangular corner of the package substrate is then located within and against a rectangular corner formed by the extensions 84.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A socket, comprising:
    a socket body having (i) a recess formed by a plurality of side walls and a base, the recess being on an inner angle of a first and a second of the side walls, the first and second side walls being substantially free of protrusions to allow respective straight surfaces of an electronic component to contact the first and second side walls, and (ii) a relief opening on an outer angle formed by the first and second side walls, the relief opening being interconnected with the recess at a corner where extensions of the first and second side walls meet and allowing space for a corner of the electronic device where the side surfaces meet;
    a plurality of contacts in a base of the recess for contacting respective ones of electric lands of an electronic device that is inserted in the recess; and
    a plurality of terminals on an external side of the socket body, the terminals being interconnected with the contacts.

2. The socket of claim 1, wherein the relief is substantially as deep as the recess.

3. The socket of claim 1, further comprising:
    a plurality of socket springs held by the socket body, each contact being on a respective one of the socket springs.

* * * * *

UNITED STATES PATENT AND TRADEMARK OFFICE
CERTIFICATE OF CORRECTION

PATENT NO. : 6,848,936 B2
DATED : February 1, 2005
INVENTOR(S) : DeFord

It is certified that error appears in the above-identified patent and that said Letters Patent is hereby corrected as shown below:

Column 5,
Line 8, delete "12" and insert -- 11 --.

Signed and Sealed this

Ninth Day of August, 2005

JON W. DUDAS
*Director of the United States Patent and Trademark Office*